United States Patent
Liu

(10) Patent No.: US 10,910,233 B2
(45) Date of Patent: Feb. 2, 2021

(54) SEMICONDUCTOR DEVICE PACKAGE AND METHOD OF MANUFACTURING THE SAME

(71) Applicant: Advanced Semiconductor Engineering, Inc., Kaohsiung (TW)

(72) Inventor: Chanyuan Liu, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 15/951,093

(22) Filed: Apr. 11, 2018

(65) Prior Publication Data

US 2019/0318938 A1 Oct. 17, 2019

(51) Int. Cl.
- *H01L 23/12* (2006.01)
- *H01L 21/56* (2006.01)
- *H01L 21/02* (2006.01)
- *H01L 23/31* (2006.01)

(52) U.S. Cl.
CPC ........ *H01L 21/565* (2013.01); *H01L 21/0243* (2013.01); *H01L 23/3135* (2013.01)

(58) Field of Classification Search
CPC ........... H01L 2924/181; H01L 2224/87; H01L 2224/16225; H01L 24/16; H01L 21/486; H01L 23/49837; H01L 21/56
USPC .......................... 257/724, 787, 778, 790, 701
See application file for complete search history.

(56) References Cited

U.S. PATENT DOCUMENTS

| | | | | |
|---|---|---|---|---|
| 4,942,454 A | * | 7/1990 | Mori | H01L 23/49503 257/674 |
| 5,430,331 A | * | 7/1995 | Hamzehdoost | H01L 21/565 257/666 |
| 6,897,550 B1 | * | 5/2005 | Zwenger | H01L 21/565 257/666 |
| 7,687,893 B2 | * | 3/2010 | Smith | H01L 23/4951 257/676 |
| 8,852,999 B2 | * | 10/2014 | Takiar | G06K 19/07732 257/100 |
| 8,963,339 B2 | * | 2/2015 | He | H01L 25/50 257/738 |
| 8,981,464 B2 | * | 3/2015 | Feng | H01L 24/03 257/329 |
| 9,281,300 B2 | * | 3/2016 | Merilo | H01L 25/162 |
| 9,451,700 B2 | | 9/2016 | Otsubo | |
| 2016/0071779 A1 | * | 3/2016 | Chen | H01L 23/31 257/787 |

* cited by examiner

*Primary Examiner* — S. V. Clark

(74) *Attorney, Agent, or Firm* — Foley & Lardner LLP

(57) ABSTRACT

A semiconductor device package includes a substrate and a monolithic encapsulant. The substrate has a first surface, a second surface opposite to the first surface and a plurality of lateral surfaces extending between the first surface and the second surface. The substrate defines a first opening and a second opening that extend between the first surface and the second surface and respectively expose the plurality of lateral surfaces. The monolithic encapsulant includes a first portion disposed on the first surface of the substrate, a second portion disposed on the second surface of the substrate and a third portion disposed within the first opening and the second opening.

18 Claims, 19 Drawing Sheets

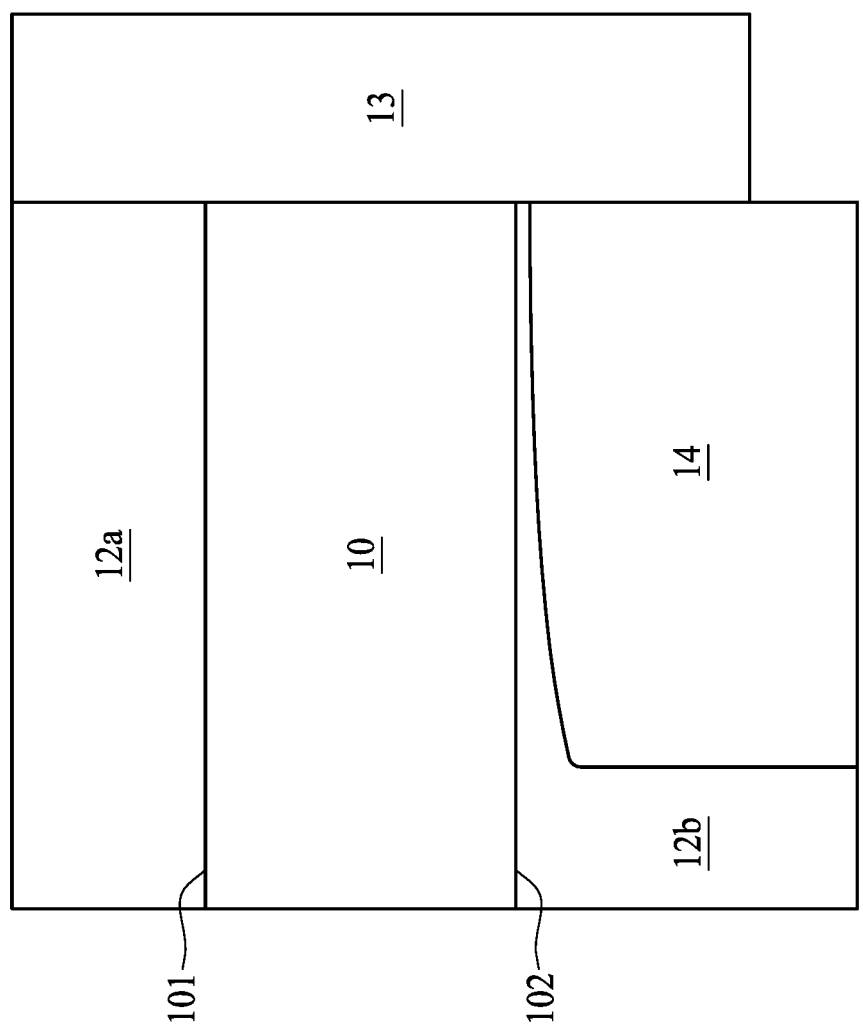

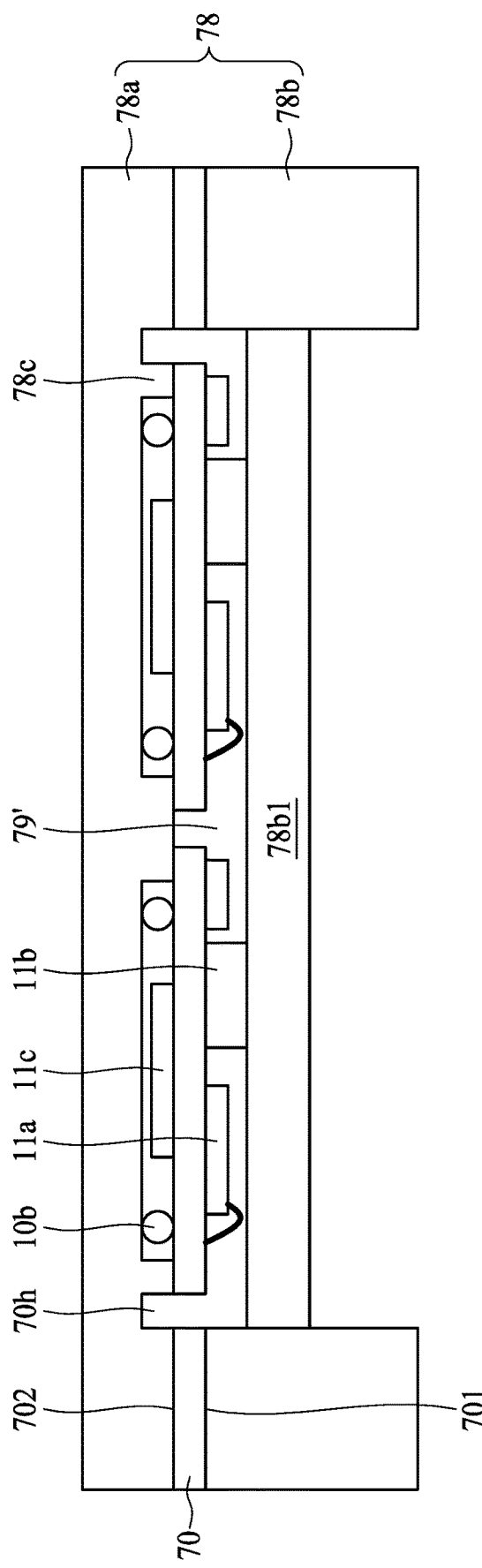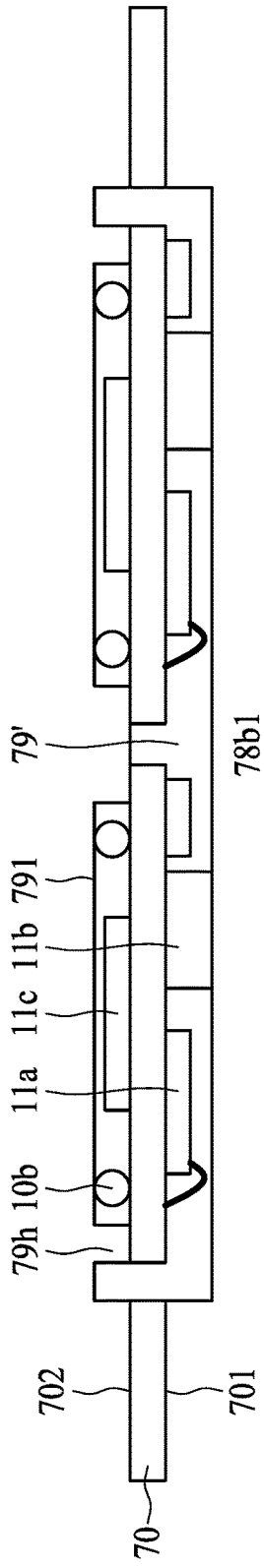
FIG. 7C
FIG. 7D

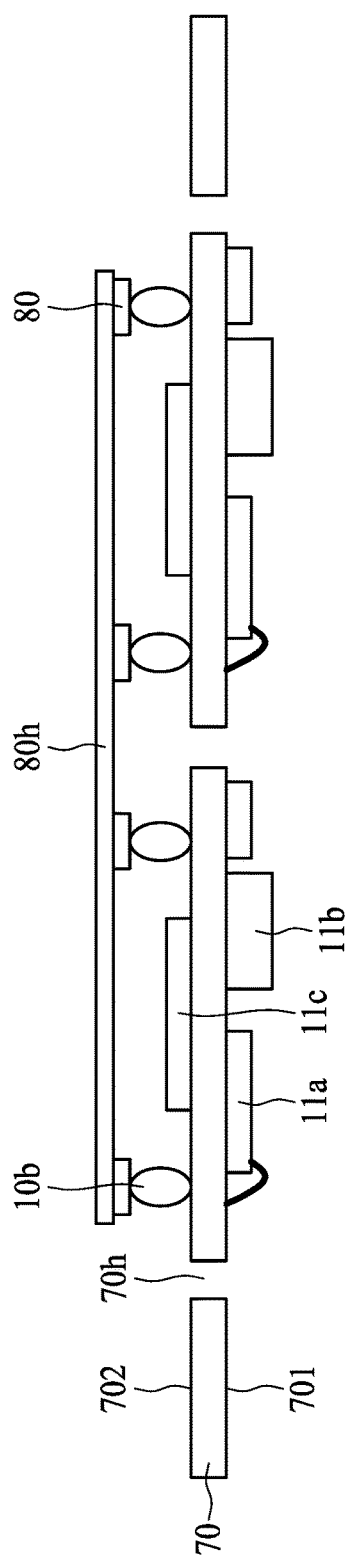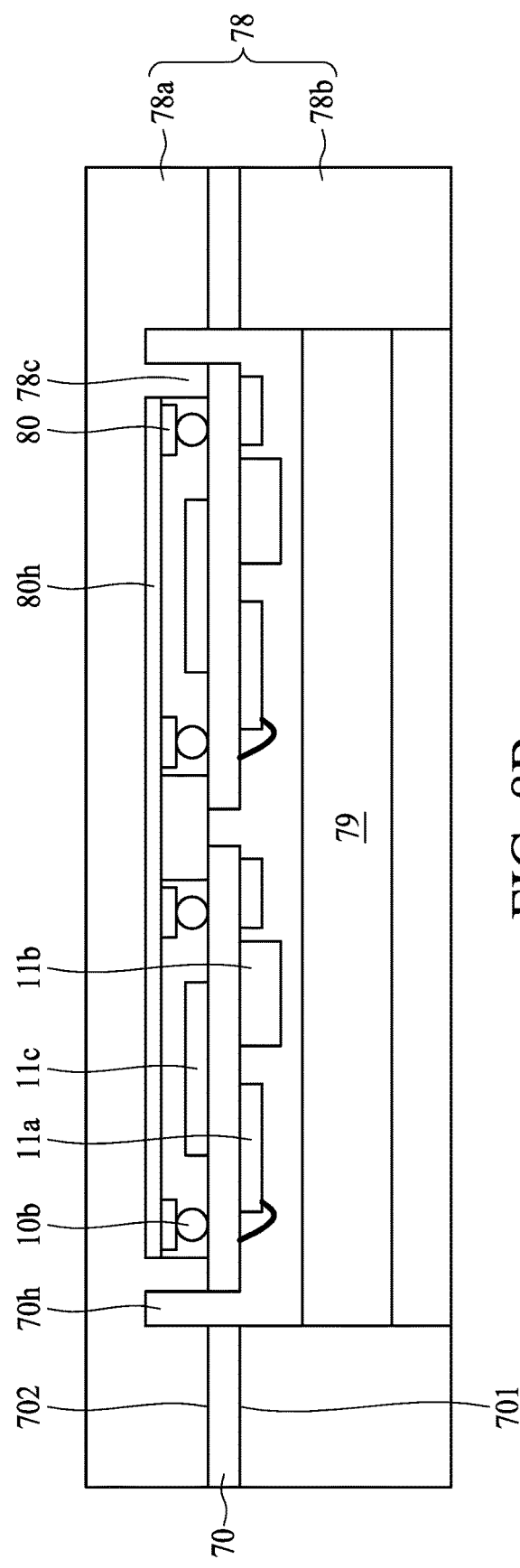

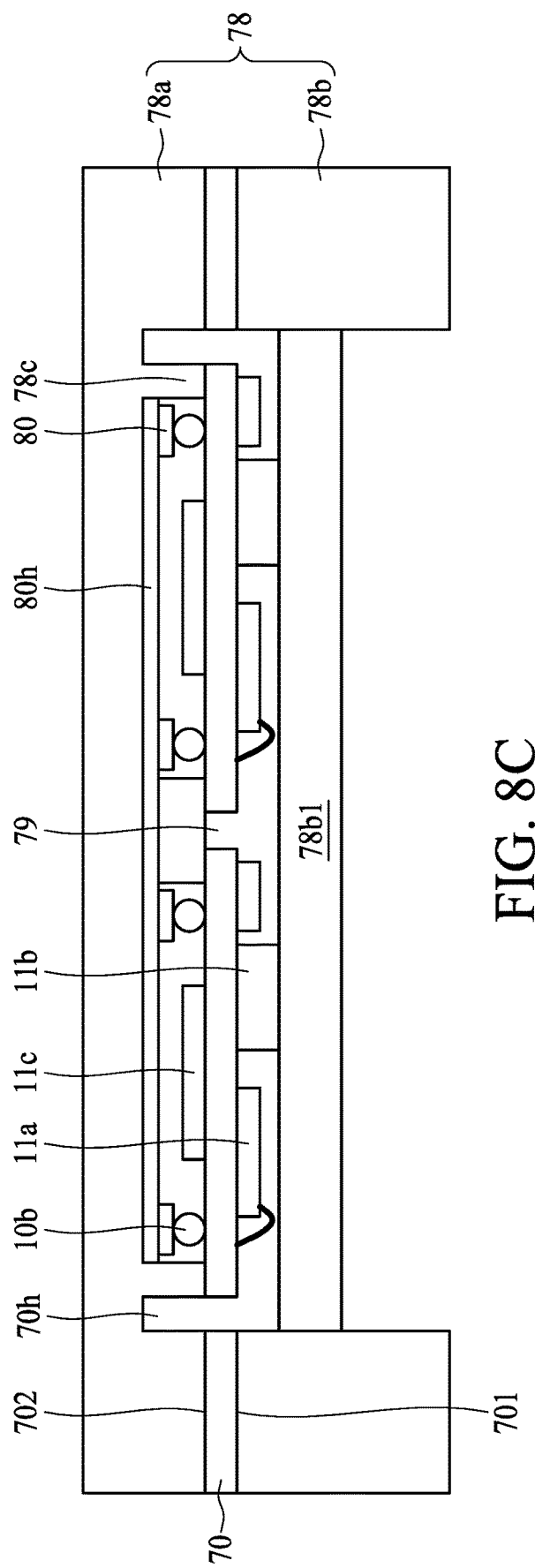
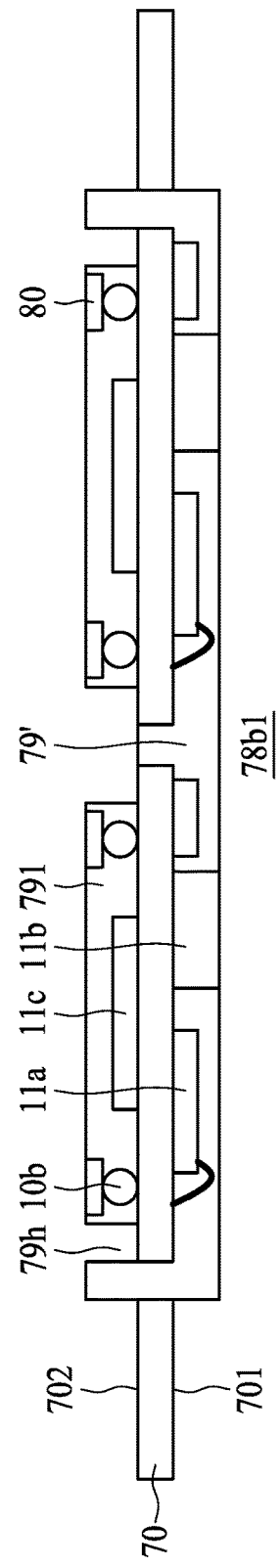
FIG. 8C
FIG. 8D

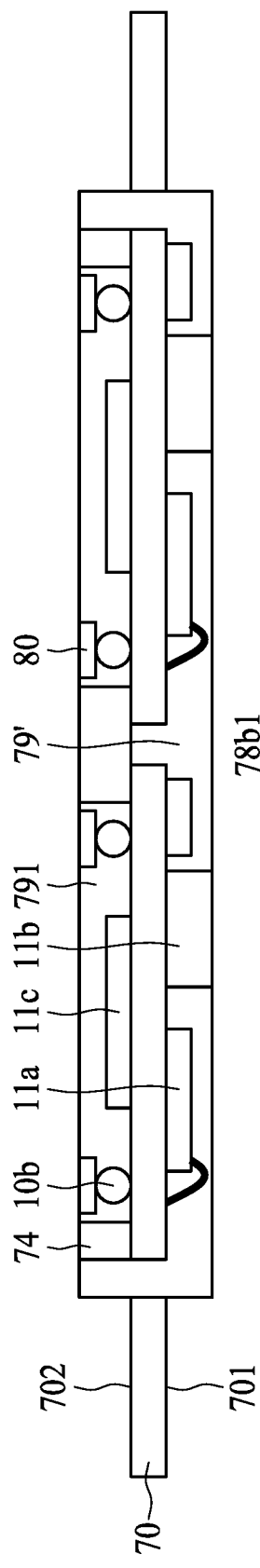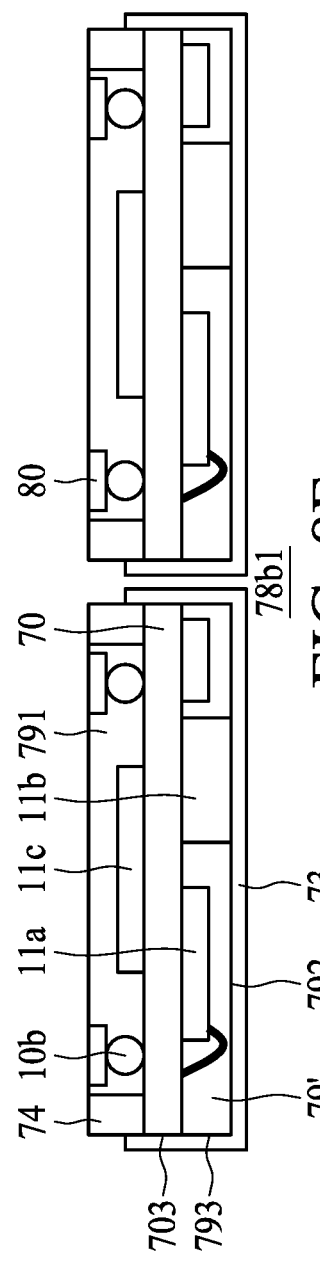

SEMICONDUCTOR DEVICE PACKAGE AND METHOD OF MANUFACTURING THE SAME

BACKGROUND

1. Technical Field

The present disclosure relates generally to a semiconductor device package and a method of manufacturing the same. The present disclosure relates to a semiconductor device package including a double-side molding structure and a method of manufacturing the same.

2. Description of the Related Art

To reduce the area or footprint of a semiconductor device package, electronic components may be mounted to an upper surface and a lower surface of a substrate. In order to protect the electronic components mounted on the substrate, a double-side molding technique can be used to form a package body on each of the upper surface and the lower surface of the substrate. Such a double-side molding technique may include two separate or individual molding operations (e.g., a first package body is formed to cover the upper surface and a second package body is formed subsequently to cover the lower surface), which can increase the time and cost for manufacturing the semiconductor device package.

SUMMARY

In one aspect, according to some embodiments, a semiconductor device package includes a substrate and a monolithic encapsulant. The substrate has a first surface, a second surface opposite to the first surface and a plurality of lateral surfaces extending between the first surface and the second surface. The substrate defines a first opening and a second opening that extend between the first surface and the second surface and that respectively expose the plurality of lateral surfaces. The monolithic encapsulant includes a first portion disposed on the first surface of the substrate, a second portion disposed on the second surface of the substrate and a third portion disposed within the first opening and the second opening.

In another aspect, according to some embodiments, a semiconductor device package includes a substrate, an encapsulant and a conductive post. The substrate has a first surface and a second surface opposite to the first surface. The encapsulant covers the first surface and the second surface of the substrate. The encapsulant defines an opening. The conductive post is disposed within the opening. A portion of the encapsulant is disposed between the conductive post and the substrate.

In yet another aspect, according to some embodiments, a method of manufacturing a semiconductor device package includes (a) providing a substrate strip including a plurality of singulation streets and a plurality of substrate units disposed between the singulation streets, wherein each of the substrate units has a first surface and a second surface opposite to the first surface, and defines at least two openings adjacent to the singulation streets and penetrating the respective substrate units; and (b) causing an encapsulant to flow from the first surfaces of the substrate units to the second surfaces of the substrate units through the openings.

BRIEF DESCRIPTION OF THE DRAWINGS

Aspects of the present disclosure are readily understood from the following detailed description when read with the accompanying drawings. It is noted that various features may not be drawn to scale, and in the drawings the dimensions of the depicted features may be arbitrarily increased or reduced for clarity of discussion.

FIG. 1D illustrates an enlarged view of a portion of a semiconductor device package in accordance with some embodiments of the present disclosure.

FIG. 7A, FIG. 7B, FIG. 7C, FIG. 7D, FIG. 7E, FIG. 7F, FIG. 7G and FIG. 7H illustrate a method of manufacturing a semiconductor device package in accordance with some embodiments of the present disclosure.

FIG. 8A, FIG. 8B, FIG. 8C, FIG. 8D, FIG. 8E and FIG. 8F illustrate a method of manufacturing a semiconductor device package in accordance with some embodiments of the present disclosure.

Common reference numerals are used throughout the drawings and the detailed description to indicate the same or similar elements. The present disclosure will be readily understood from the following detailed description taken in conjunction with the accompanying drawings.

DETAILED DESCRIPTION

Figure 1A:
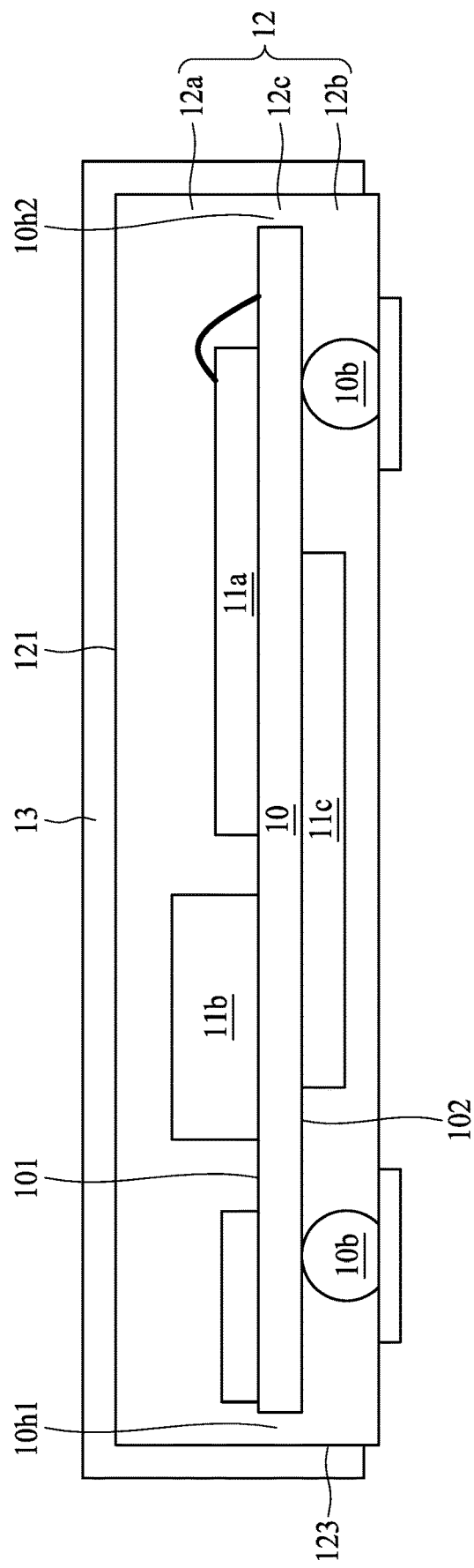
FIG. 1A illustrates a cross-sectional view of a semiconductor device package in accordance with some embodiments of the present disclosure.

FIG. 1A illustrates a cross-sectional view of some embodiments of a semiconductor device package 1 in accordance with a first aspect of the present disclosure. The semiconductor device package 1 includes a substrate 10, electronic components 11a, 11b, 11c, a package body 12 and a conductive layer 13.

The substrate 10 may be, for example, a printed circuit board (PCB), such as a paper-based copper foil laminate, a composite copper foil laminate, a polymer-impregnated glass-fiber-based copper foil laminate, or a combination of two or more thereof. The substrate 10 may include an interconnection structure, such as a redistribution layer (RDL). The substrate 10 has a top surface 101 (also referred to as "first surface") and a bottom surface 102 (also referred to as "second surface") opposite to the top surface 101. The substrate 10 defines through holes (or openings) 10h1 and 10h2 penetrating the substrate 10. In some embodiments, the through holes 10h1 and 10h2 of the substrate 10 are adjacent to the edges of the substrate 10. In some embodiments, the through holes 10h1 and 10h2 are gaps between the substrate 10 and the conductive layer 13.

One or more electrical contacts 10b are disposed on the bottom surface 102 of the substrate 10 and may be electrically connected to the top surface 101 of the substrate 10 through the interconnection structure. In some embodiments, the electrical contacts 10b are Controlled Collapse Chip Connection (C4) bumps, solder bumps, one or more Land Grid Arrays (LGA), or a combination of two or more thereof. A portion of each of the one or more electrical contacts 10b is exposed from the package body 12 to provide electrical connections between the semiconductor device package 1 and other circuits or conductive pads. In some embodiments, the electrical contacts 10b are copper pillars.

The electronic components 11a and 11b are disposed on the top surface 101 of the substrate 10. The electronic component 11a may be an active component, such as an integrated circuit (IC) chip or a die. The electronic component 11b may be a passive component, such as a capacitor, a resistor or an inductor. The electronic components 11a and 11b may be electrically connected to one or more of another electronic component and/or the substrate 10 (e.g., to the interconnection layer), and electrical connection may be attained by way of flip-chip or wire-bond techniques.

The electronic component 11c is disposed on the bottom surface 102 of the substrate 10. The electronic component 11c may be an active component (such as an IC chip or a die) or a passive component (such as a capacitor, a resistor or an inductor). The electronic component 11c may be electrically connected to the substrate 10 (e.g., to the interconnection layer), and electrical connection may be attained by way of flip-chip or wire-bond techniques. The electronic component 11c may be electrically connected to the electronic components 11a and 11b through the interconnection layer within the substrate 10.

The package body 12 includes portions 12a, 12b and 12c, and covers or encapsulates the substrate 10, the electronic components 11a, 11b, 11c and a portion of the electrical contacts 10b. The portion 12a of the package body 12 is disposed on the top surface 101 of the substrate 10, and may extend laterally beyond the substrate 10, and covers the electronic components 11a and 11b. The portion 12b of the package body 12 is disposed on the bottom surface 102 of the substrate 10, and may extend laterally beyond the substrate 10, and covers the electronic component 11c and a portion of the electrical contacts 10b. The portion 12c of the package body 12 is disposed within the through holes 10h1 and 10h2 of the substrate 10. In some embodiments, the portions 12a, 12b and 12c of the package body 12 are formed in a single process, and may be integrally formed. For example, the package body 12 is a monolithic structure including a molding compound (or encapsulant). For example, during the process for forming the package body 12, the through holes 10h1 and 10h2 of the substrate 10 allow the molding compound to flow from the top surface 101 to the bottom surface 102, or from the bottom surface 102 to the top surface 101, to form the package body 12 in a single process. In some embodiments, the package body 12 includes an epoxy resin having fillers, a molding compound (e.g., an epoxy molding compound or other molding compound), a polyimide, a phenolic compound or material, a material with a silicone dispersed therein, or a combination thereof.

The conductive layer 13 is disposed on at least a portion of an external surface of the package body 12 and covers the package body 12. For example, the conductive layer 13 is disposed on a top surface 121 of the package body 12 and a portion of a lateral surface 122 of the package body 12. The conductive layer 13 is electrically connected to a grounding element of the substrate 10 (not shown). In some embodiments, the conductive layer 13 is a conformal shielding layer. In some embodiments, the conductive layer 13 is a conductive thin film, and may include, for example, aluminum (Al), copper (Cu), chromium (Cr), tin (Sn), gold (Au), silver (Ag), nickel (Ni) or stainless steel, or a mixture, an alloy, or other combination thereof. The conductive layer 13 may include a single conductive layer or multiple conductive layers.

Figure 1B:
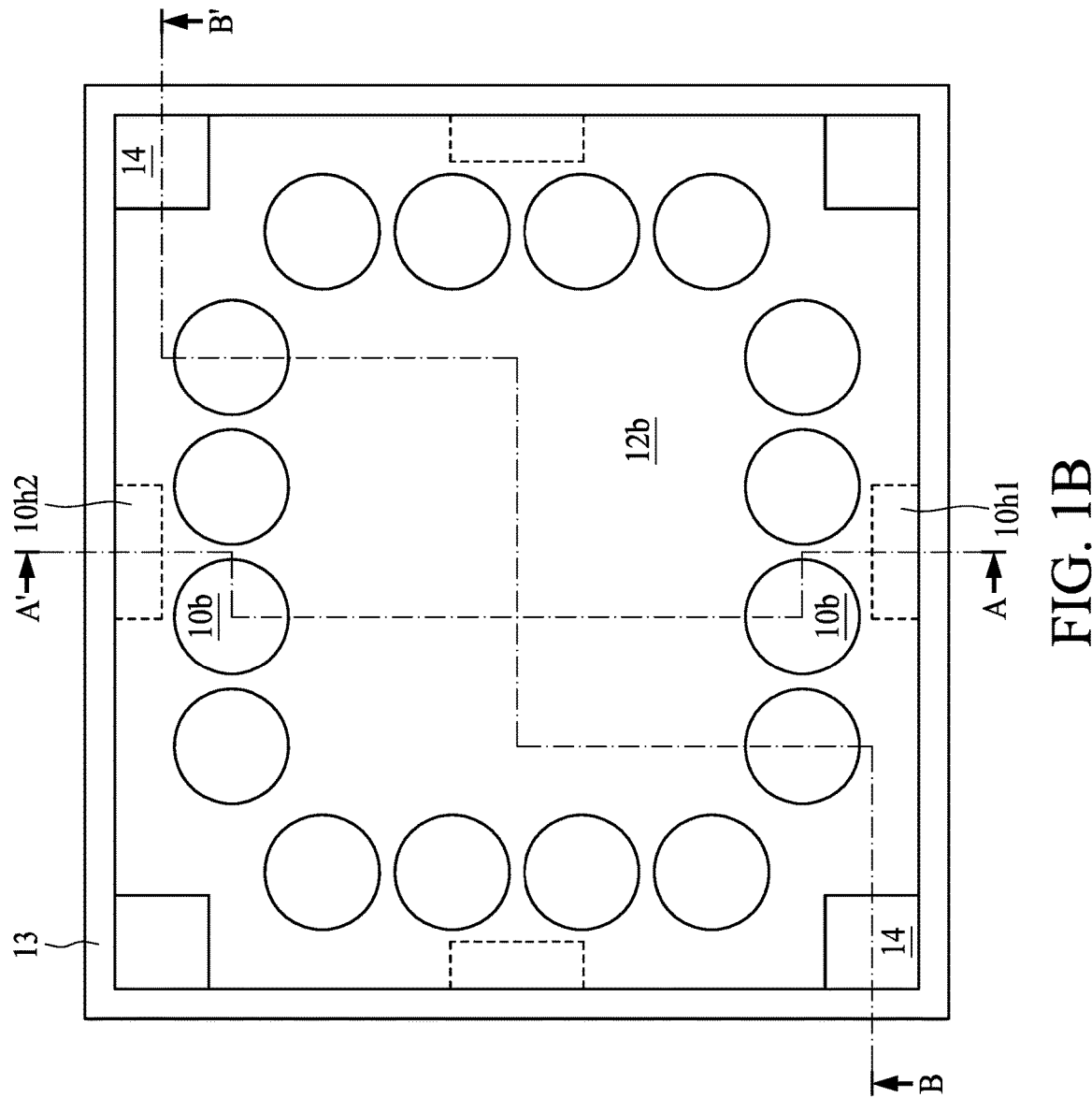
FIG. 1B illustrates a bottom view of a semiconductor device package in accordance with some embodiments of the present disclosure.

FIG. 1B illustrates a bottom view of the semiconductor device package 1 in accordance with some embodiments of the present disclosure. The cross-sectional view of the semiconductor device package 1 in FIG. 1A is taken across the line A-A' in FIG. 1B. As shown in FIG. 1B, the through holes 10h1 and 10h2 are adjacent to respective lateral surfaces of the substrate 10 and each of the through holes 10h1 and 10h2 is located at or near the middle of a respective corresponding edge of the substrate 10 (e.g. is spaced from an end of the corresponding edge by a distance in a range of about 40% to about 60% of a total length of the corresponding edge). The semiconductor device package 1 further includes conductive posts 14 disposed at corners of the semiconductor device package 1. The conductive posts 14 may include a metal, an alloy, or other conductive material.

Figure 1C:
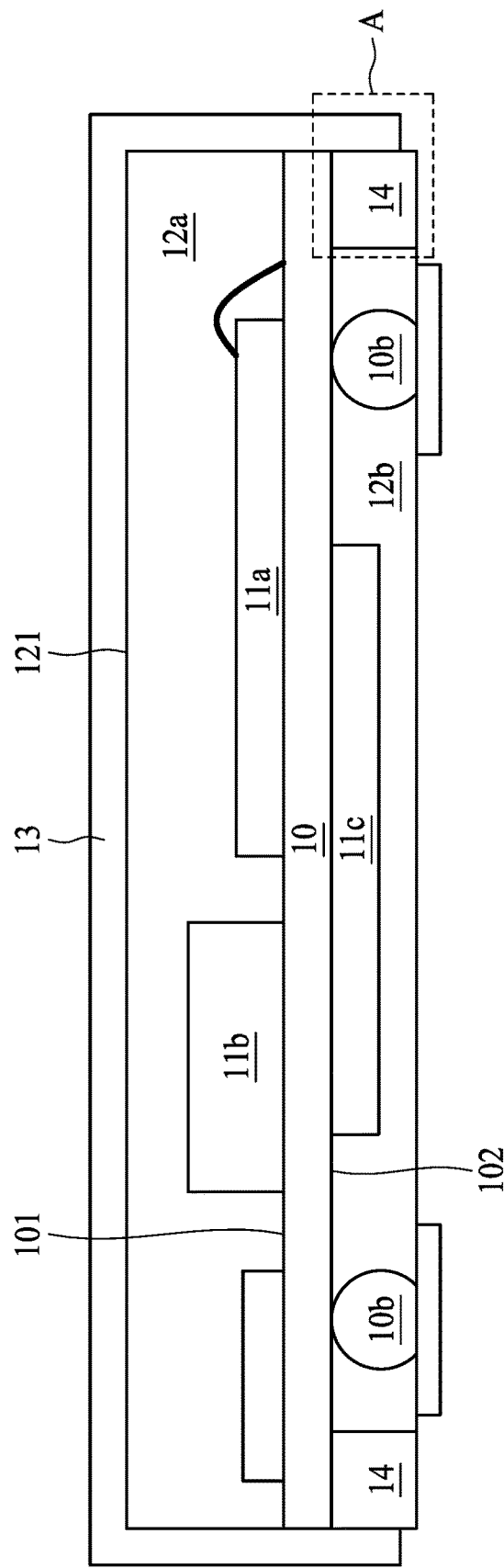
FIG. 1C illustrates a cross-sectional view of a semiconductor device package in accordance with some embodiments of the present disclosure.

FIG. 1C illustrates a cross-sectional view of the semiconductor device package 1 in FIG. 1B taken across the line B-B' in accordance with some embodiments of the present disclosure. As shown in FIG. 1C, the conductive posts 14 are disposed on the bottom surface 102 of the substrate 10 and are partially covered by the second portion 12b of the package body 12. For example, a lateral surface of the conductive post 14 is exposed from the package body 12. The portion of the conductive post 14 exposed from the package body 12 is in contact with the conductive layer 13.

FIG. 1D illustrates an enlarged view of a portion of the semiconductor device package 1 in FIG. 1C surrounded by a dotted-line square A in accordance with some embodiments of the present disclosure. As shown in FIG. 1D, the conductive post 14 is separated from the bottom surface 102 of the substrate 10 by the second portion 12b of the package body 12. For example, a portion of the second portion 12b of the package body 12 is disposed between the conductive post 14 and the bottom surface 102 of the substrate 10. For example, there is a gap between the conductive post 14 and the bottom surface 102 of the substrate 10. For example, the conductive post 14 is spaced apart from the bottom surface 102 of the substrate 10. For example, the conductive post 14 is electrically insulated from the substrate 10.

In a comparative semiconductor device package that omits the conductive post, heat generated within the semiconductor device package is dissipated to the outside through the molding compound. However, compared to conductive materials (e.g., metal), the thermal conductivity of the molding compound is relatively low, and thus the performance of the thermal dissipation of the comparative semiconductor device package is poor. In accordance with the embodiments in FIG. 1C and FIG. 1D, the conductive post 14 can provide a thermal dissipation path for the semiconductor device package 1. For example, the heat generated by the electronic components 11a, 11b and 11c or any other electronic components within the semiconductor device package 1 can be dissipated to the outside of the semiconductor device package 1 through the conductive post 14, which would improve the performance of the heat dissipation of the semiconductor device package 1. In addition, since the conductive layer 13 is in contact with the lateral surface of the package body 12 (which may include the portions 12a, 12b and 12c), the substrate 10 and the conductive post 14, the conductive layer 13 can further improve the performance of the heat dissipation of the semiconductor device package 1.

Figure 2:
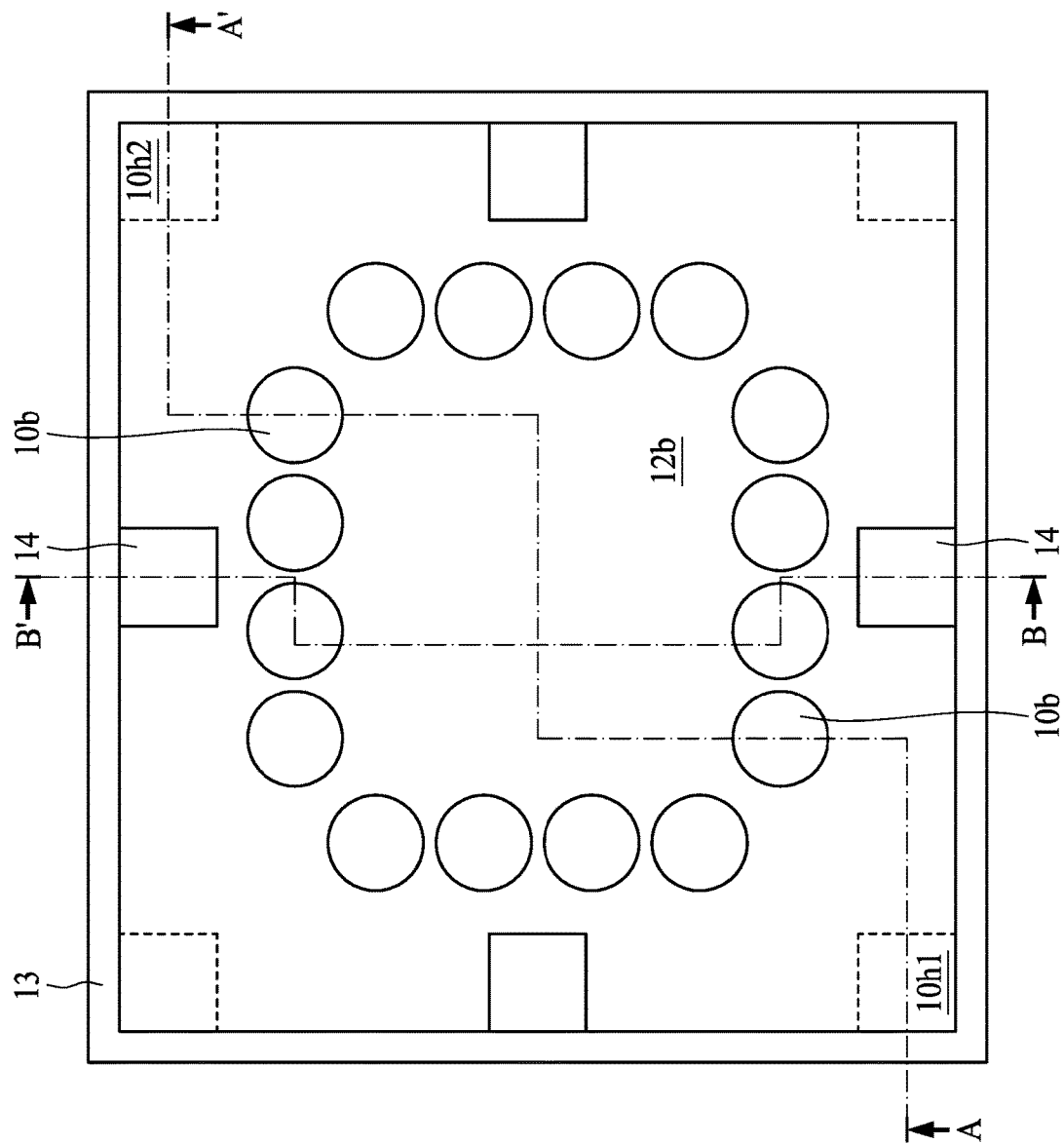
FIG. 2 illustrates a bottom view of a semiconductor device package in accordance with some embodiments of the present disclosure.

FIG. 2 illustrates a bottom view of a semiconductor device package 2 in accordance with some embodiments of the present disclosure. The semiconductor device package 2 is similar to the semiconductor device package 1 in FIG. 1B except that in the semiconductor device package 2, the through holes 10h1, 10h2 are disposed at the corners of the semiconductor device package 2, and each of the conductive posts 14 is located at or near the middle of a respective corresponding edge of the substrate 10 (e.g. is spaced from an end of the corresponding edge by a distance in a range of about 40% to about 60% of a total length of the corresponding edge). In some embodiments, the cross-sectional view of the semiconductor device package 2 taken along the line A-A' is similar to that of the semiconductor device package 1 shown in FIG. 1A. In some embodiments, the cross-sectional view of the semiconductor device package 2 taken along the line B-B' is similar to that of the semiconductor device package 1 shown in FIG. 1C.

Figure 3A:
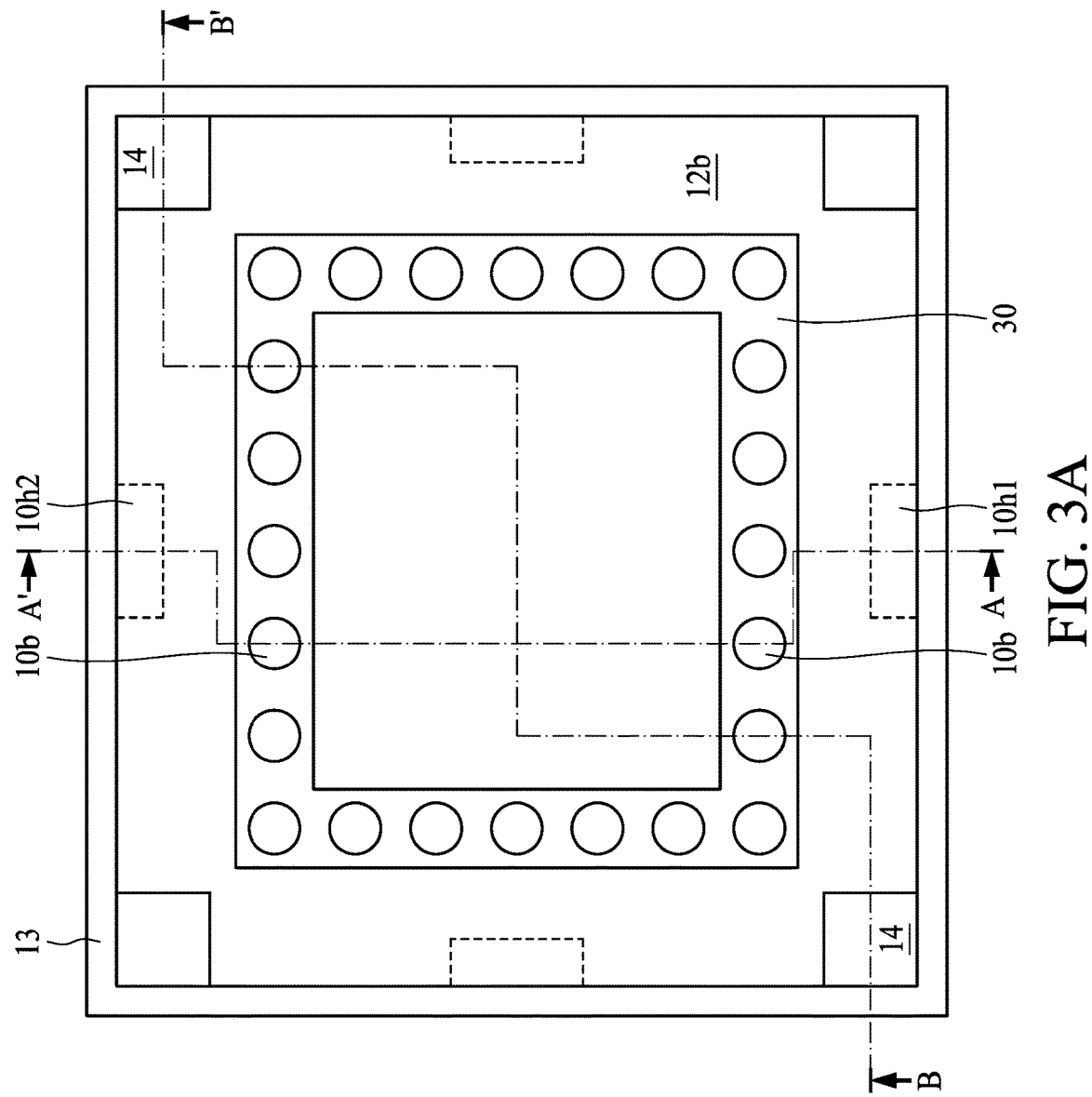
FIG. 3A illustrates a bottom view of a semiconductor device package in accordance with some embodiments of the present disclosure.

FIG. 3A illustrates a bottom view of a semiconductor device package 3 in accordance with some embodiments of the present disclosure. The semiconductor device package 3 is similar to the semiconductor device package 1 in FIG. 1B except that the semiconductor device package 3 further includes a frame board 30 disposed along the electrical contacts 10b. For example, the frame board 30 and the electrical contacts 10b are arranged along or near the periphery of the bottom surface 102 of the substrate 10.

Figure 3B:
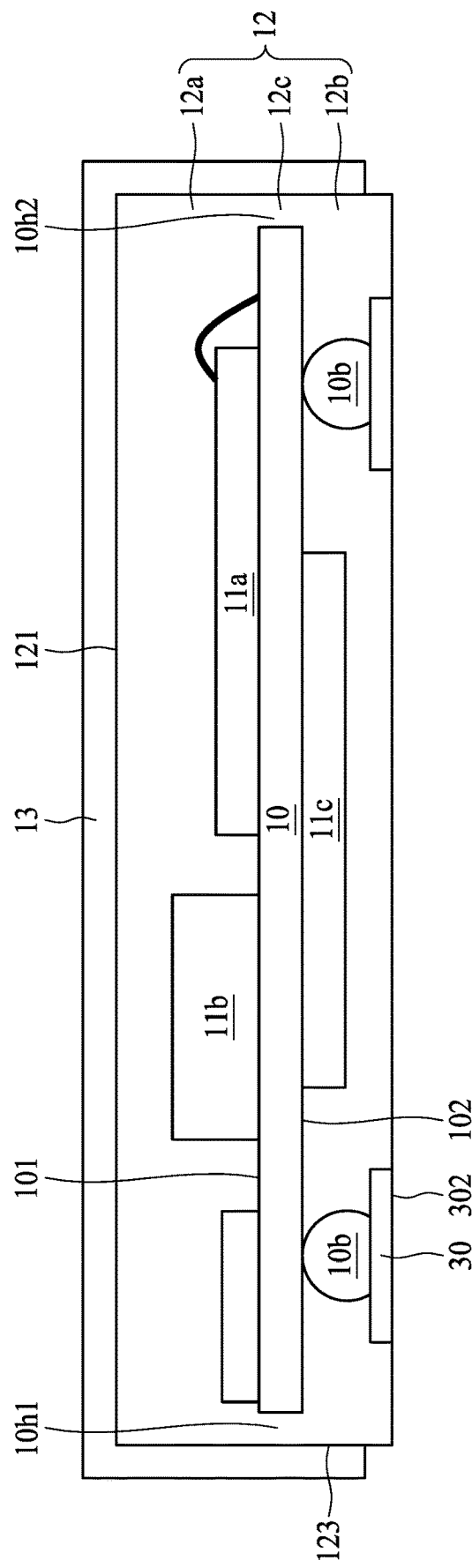
FIG. 3B illustrates a cross-sectional view of a semiconductor device package in accordance with some embodiments of the present disclosure.

FIG. 3B illustrates a cross-sectional view of the semiconductor device package 3 in FIG. 3A taken along the line A-A' in accordance with some embodiments of the present disclosure. The frame board 30 is disposed on the electrical contacts 10b. The frame board 30 may include at least one via penetrating the frame board 30 to provide electrical connections for the electrical contacts 10b (not shown). In some embodiments, a bottom surface 302 of the frame board 30 is exposed from the package body 12. The frame board 30 may include, for example, a printed circuit board, such as a paper-based copper foil laminate, a composite copper foil laminate, or a polymer-impregnated glass-fiber-based copper foil laminate.

Figure 3C:
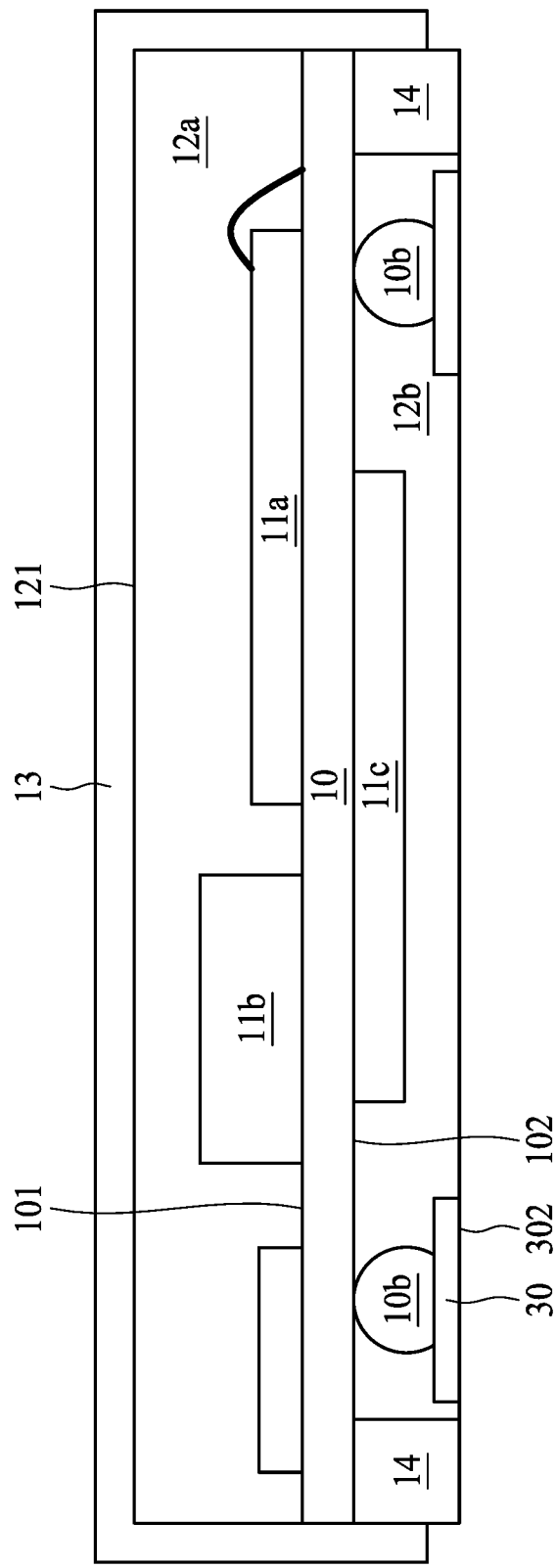
FIG. 3C illustrates a cross-sectional view of a semiconductor device package in accordance with some embodiments of the present disclosure.

FIG. 3C illustrates a cross-sectional view of the semiconductor device package 3 in FIG. 3A taken along the line B-B' in accordance with some embodiments of the present disclosure. The semiconductor device package 3 in FIG. 3C is similar to the semiconductor 1 in FIG. 1C except that the semiconductor device package 3 further includes the frame board 30 disposed on the electrical contacts 10b.

Figure 4:
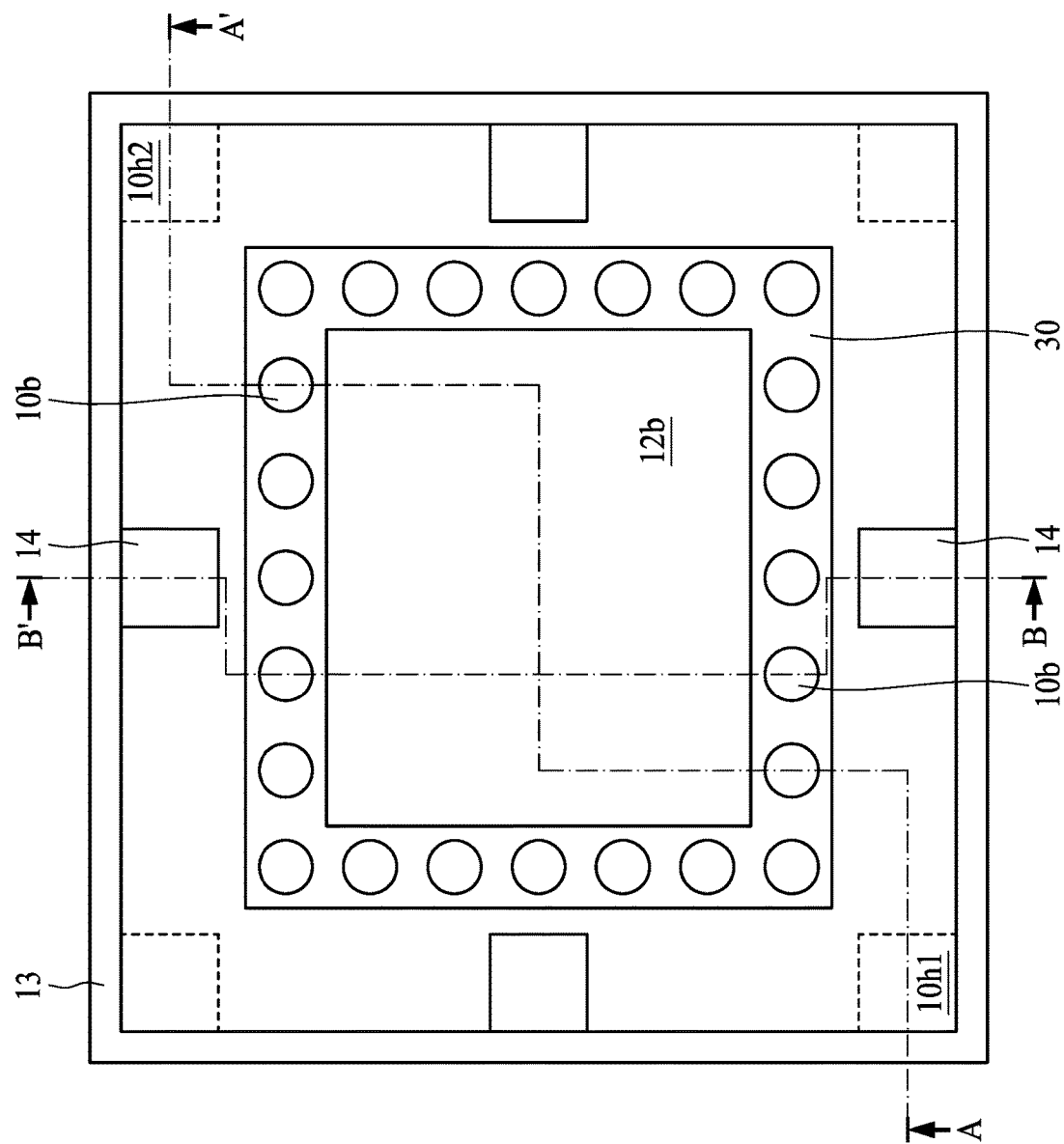
FIG. 4 illustrates a bottom view of a semiconductor device package in accordance with some embodiments of the present disclosure.

FIG. 4 illustrates a bottom view of a semiconductor device package 4 in accordance with some embodiments of the present disclosure. The semiconductor device package 4 is similar to the semiconductor device package 3 in FIG. 3A except that in the semiconductor device package 4, the through holes 10h1, 10h2 are disposed at the corners of the semiconductor device package 4 and that each of the conductive posts 14 is located at or near the middle of a respective corresponding edge of the substrate 10 (e.g. is spaced from an end of the corresponding edge by a distance in a range of about 40% to about 60% of a total length of the corresponding edge). In some embodiments, the cross-sectional view of the semiconductor device package 4 taken along the line A-A' is similar to that of the semiconductor device package 3 shown in FIG. 3B. In some embodiments, the cross-sectional view of the semiconductor device package 4 taken along the line B-B' is similar to that of the semiconductor device package 3 shown in FIG. 3C.

Figure 5A:
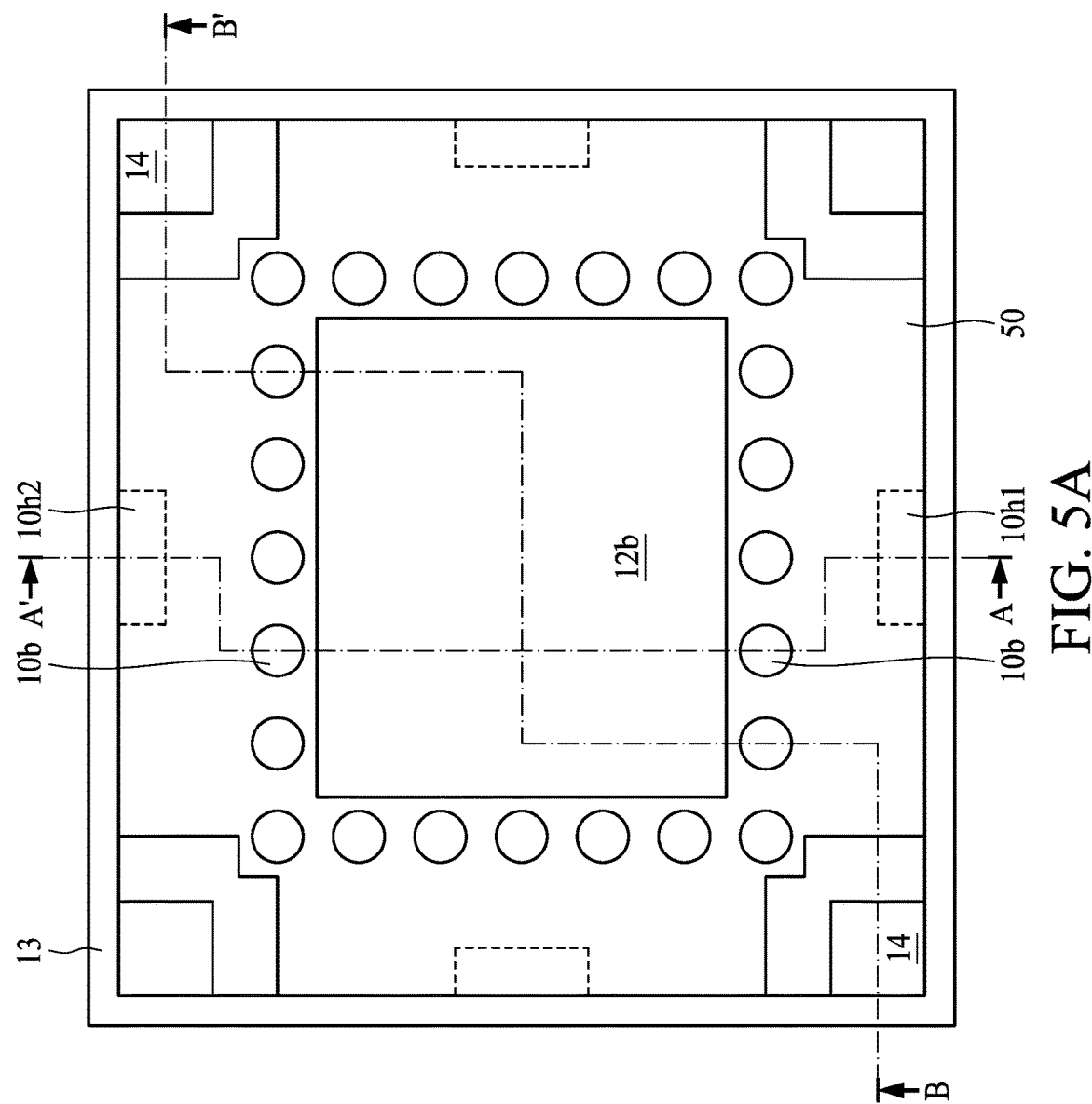
FIG. 5A illustrates a bottom view of a semiconductor device package in accordance with some embodiments of the present disclosure.
Figure 5B:
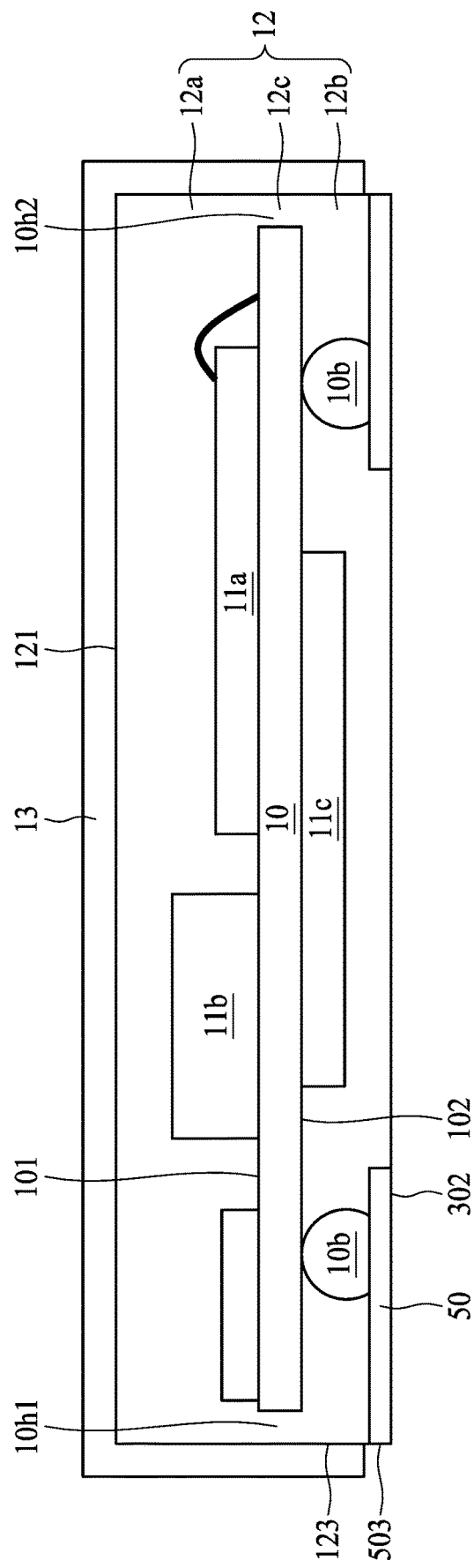
FIG. 5B illustrates a cross-sectional view of a semiconductor device package in accordance with some embodiments of the present disclosure.

FIG. 5A illustrates a bottom view of a semiconductor device package 5 in accordance with some embodiments of the present disclosure. The semiconductor device package 5 is similar to the semiconductor device package 3A in FIG. 3A except that the frame board 50 of the semiconductor device package 5 further extends to the edge of the second portion 12b of the package body 12. As shown in FIG. 5B, which illustrates a cross-sectional view of the semiconductor device package 5 in FIG. 5A taken along the line A-A', the frame board 50 extends under the through holes 10h1 and 10h2. For example, a lateral surface 503 of the frame board 50 is substantially coplanar to a lateral surface 123 of the package body 12. In some embodiments, the cross-sectional view of the semiconductor device package 5 taken along the line B-B' is similar to that of the semiconductor device package 3 shown in FIG. 3C. The frame board 50 may define openings or notches that accommodate the conductive posts 14. There may be respective gaps between the frame board 50 and each of the conductive posts 14.

Figure 6:
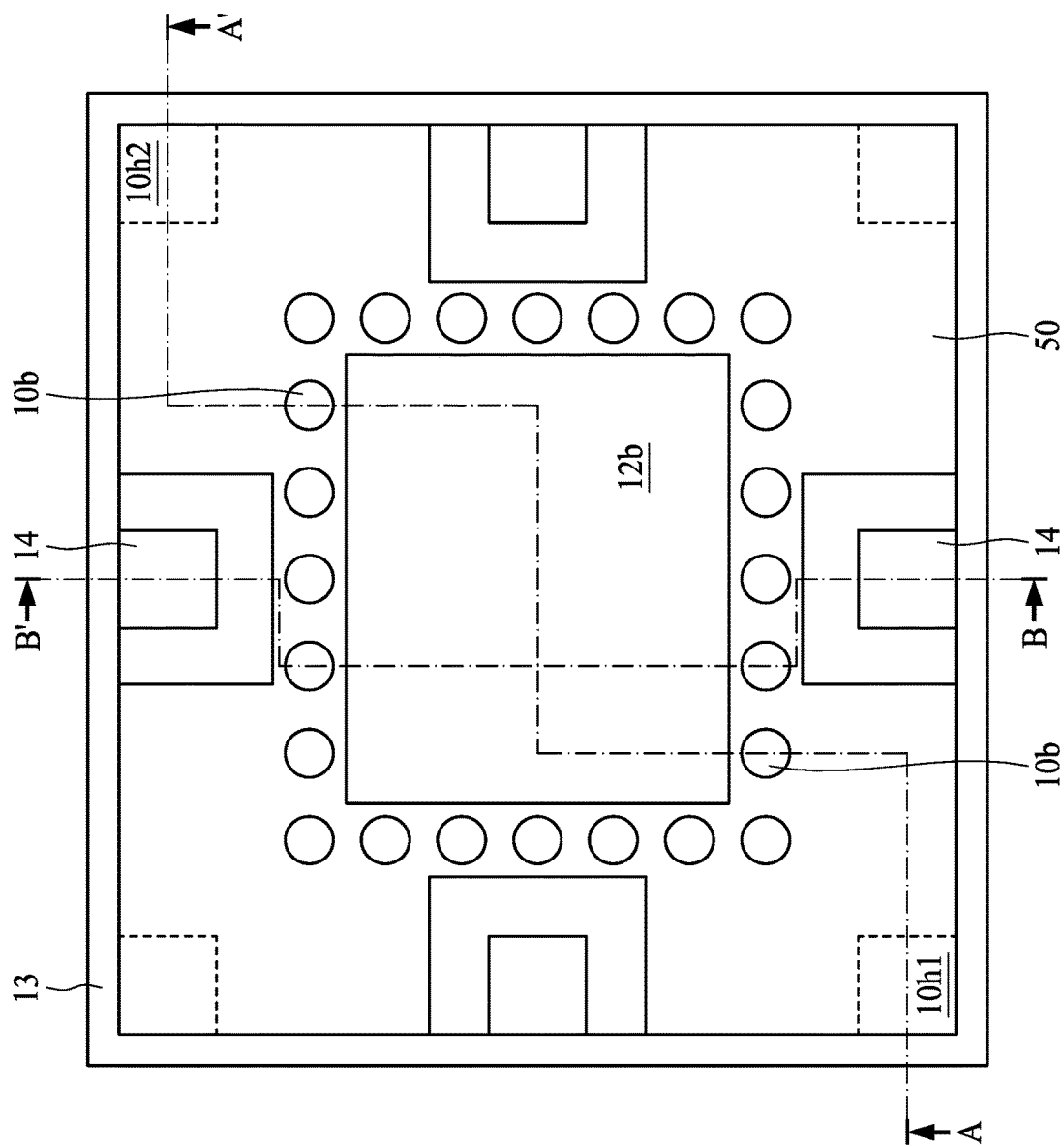
FIG. 6 illustrates a bottom view of a semiconductor device package in accordance with some embodiments of the present disclosure

FIG. 6 illustrates a bottom view of a semiconductor device package 6 in accordance with some embodiments of the present disclosure. The semiconductor device package 6 is similar to the semiconductor device package 5 in FIG. 5A except that in the semiconductor device package 6, the through holes 10h1, 10h2 are disposed at the corners of the semiconductor device package 6 and that each of the conductive posts 14 is located at or near the middle of a respective corresponding edge of the substrate 10 (e.g. is spaced from an end of the corresponding edge by a distance in a range of about 40% to about 60% of a total length of the corresponding edge). In some embodiments, the cross-sectional view of the semiconductor device package 6 taken along the line A-A' is similar to that of the semiconductor device package 5 shown in FIG. 5B. In some embodiments, the cross-sectional view of the semiconductor device package 6 taken along the line B-B' is similar to that of the semiconductor device package 3 shown in FIG. 3C. The frame board 50 may define openings or notches that accommodate the conductive posts 14. There may be respective gaps between the frame board 50 and each of the conductive posts 14.

FIG. 7A, FIG. 7B, FIG. 7C, FIG. 7D, FIG. 7E, FIG. 7F, FIG. 7G and FIG. 7H are cross-sectional views of a semiconductor structure at various stages of fabrication, in accordance with some embodiments of a method of manufacturing a semiconductor device package of the present disclosure. Various figures have been simplified to more clearly present aspects of the present disclosure.

Figure 7A:
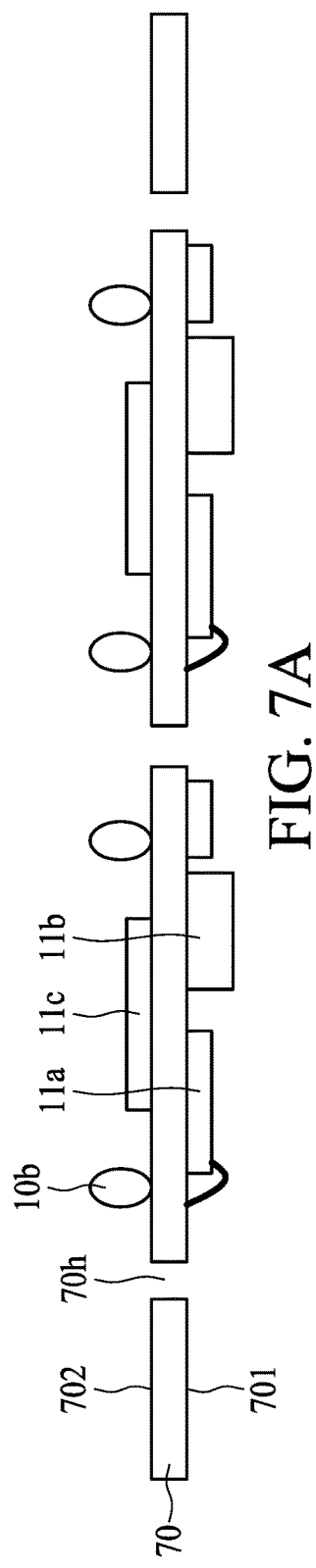

Referring to FIG. 7A, a carrier strip (or a carrier panel) including a carrier (or substrate) 70 is provided. The carrier strip defines a plurality of openings (or through holes) 70h penetrating the carrier strip. Electronic components 11a and 11b are disposed on a surface 701 of the carrier strip, and an electronic component 11c is disposed on a surface 702 of the carrier strip opposite to the surface 701. In some embodiments, the electronic components 11a, 11b and 11c are disposed on the carrier strip by a surface mount technique, a wire bonding technique or a flip-chip technique. Electrical contacts 10b are disposed on the surface 702 of the carrier strip. In some embodiments, the electrical contacts 10b are solder bumps or copper pillars.

Figure 7B:
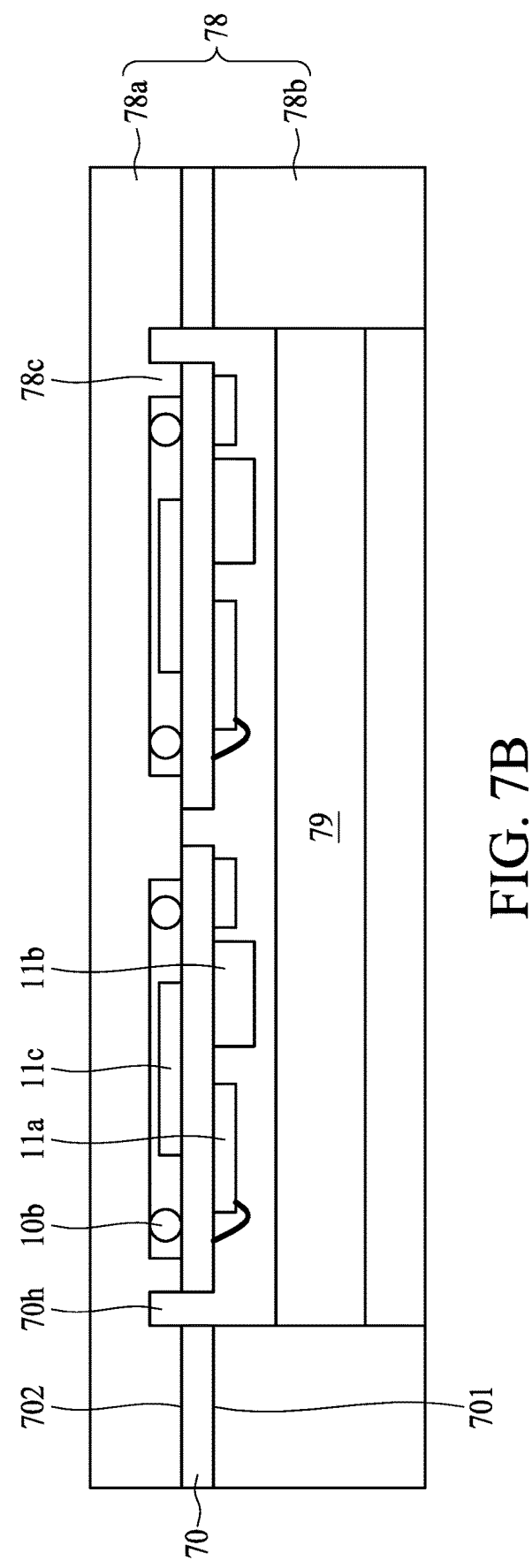

Referring to FIG. 7B, the carrier strip is disposed within a molding chamber 78. The molding chamber 78 includes a first mold chase 78a and a second mold chase 78b corresponding to the first mold chase 78a. In some embodiments, the edge of the carrier strip is sandwiched by the first mold chase 78a and the second mold chase 78b to fix the carrier strip during the molding process. In some embodiments, the first mold chase 78a includes one or more protruding structures 78c (e.g., dummy runners) in contact with the surface 702 of the carrier strip. A molding material 79 is injected or applied to the second mold chase 78b. The molding material 79 may include an epoxy resin including fillers, a molding compound (e.g., an epoxy molding compound or other molding compound), a polyimide, a phenolic compound or material, a material including a silicone dispersed therein, or a combination thereof.

Referring to FIG. 7C, a plate 78b1 of the second mold chase 78b moves toward the first mold chase 78a to push the molding material 79 to flow from the surface 701 of the carrier strip to the surface 702 of the carrier strip through the openings 70h. Then, the molding material 79 is cured or hardened by providing heat to the molding material 79 to form an encapsulant 79' covering the electronic components 11a, 11b, 11c and the electrical contacts 10b. For example, the encapsulant 79' is formed by a compression molding technique.

Referring to FIG. 7D, the structure in FIG. 7C is removed from the molding chamber 78. A grinding process is carried out on a surface 791 of the encapsulant 79' to expose a portion of the electrical contacts 10b. After the structure in FIG. 7C is removed from the molding chamber 78, one or more openings 79h corresponding to the one or more protruding structures 78c expose one or more portions of the surface 702 of the carrier strip that were in contact with the one or more protruding structure 78c.

Figure 7E:
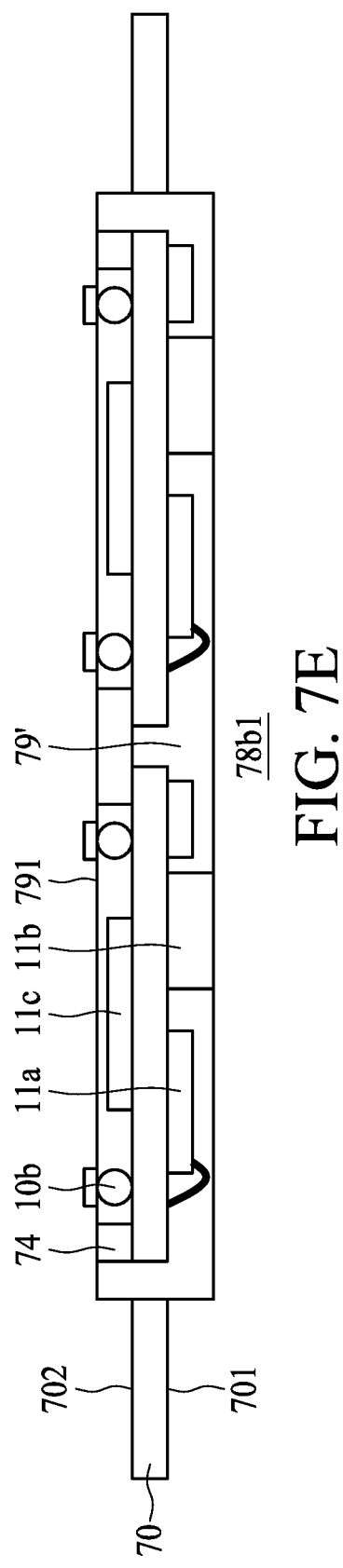
Figure 7F:
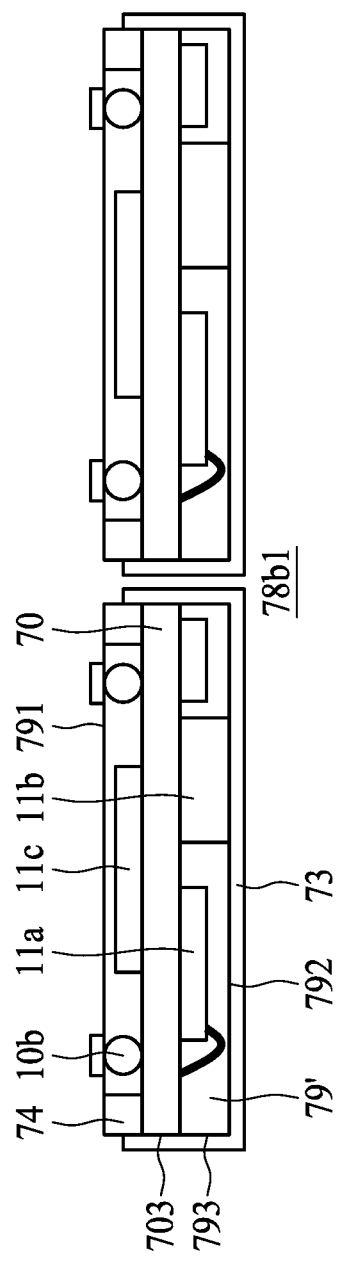

Referring to FIG. 7E, the openings 79h are filled with conductive materials to form conductive posts 74. Then, singulation may be performed to separate out individual semiconductor device packages as shown in FIG. 7F. That is, the singulation is performed through the encapsulant 79' and the carrier strip including the carrier 70. The singulation may be performed, for example, by using a dicing saw, laser or other appropriate cutting technique.

Figure 7H:
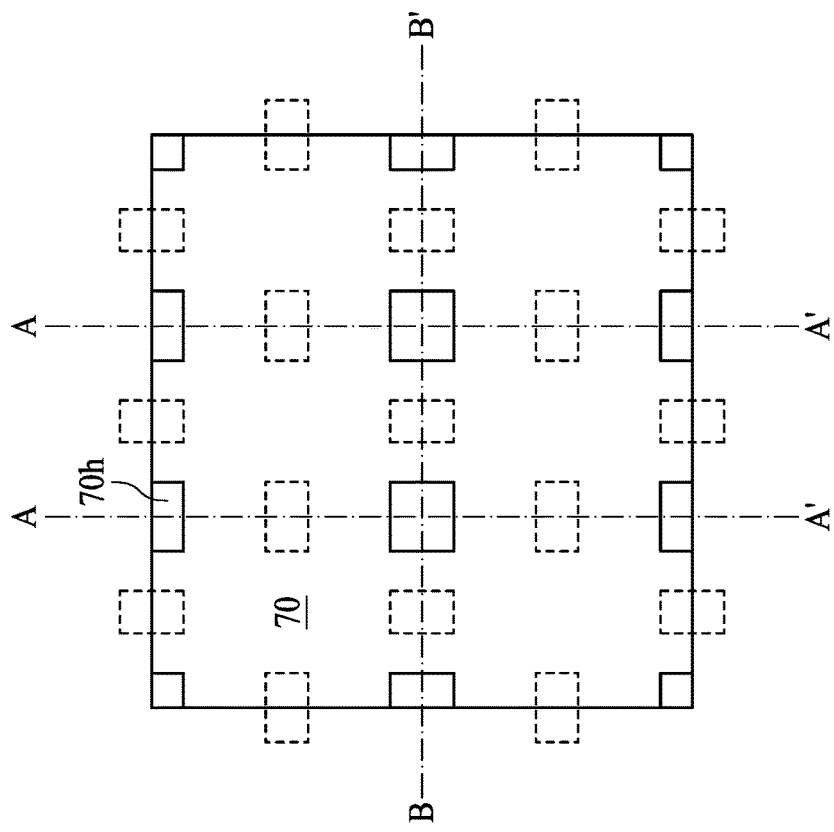
Figure 7G:
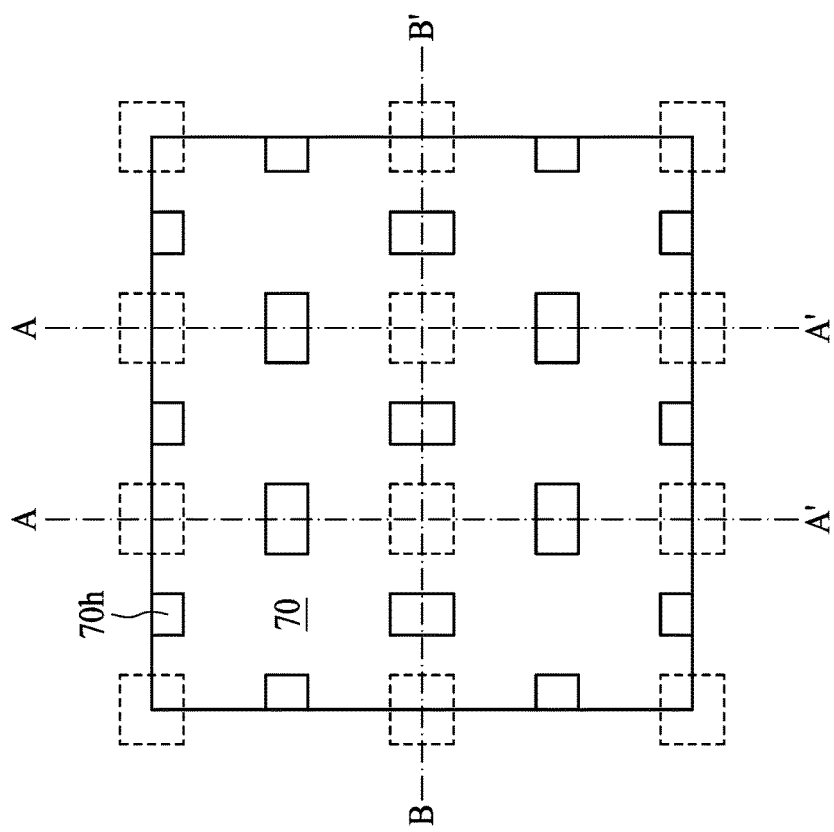

In some embodiments, as shown in FIG. 7G, which illustrates the carrier strip from the surface 702, the singulation can be carried out along the lines A-A' and B-B', which can be singulation streets. In FIG. 7G, a portion of the carrier strip circled by dotted-line squares is where the one or more protruding structure 78c of the molding chamber 78 are disposed. In some embodiments, as shown in FIG. 7H, which illustrates the carrier strip from the surface 702, the singulation can be carried out along the lines A-A' and B-B', which can be singulation streets. In FIG. 7H, a portion of the carrier strip circled by dotted-line squares is where the one or more protruding structures 78c of the molding chamber 78 are disposed.

As shown in FIG. 7F, a conductive layer 73 is formed to cover surfaces 792 and 793 of the encapsulant 79', a lateral surface 703 of the carrier 70 and a portion of lateral surfaces of the conductive posts 74. In some embodiments, the conductive layer 73 is formed by, for example, sputtering or other suitable techniques. In some embodiments, the semiconductor device package in FIG. 7F is similar to the semiconductor device package 1 in FIG. 1A.

FIG. 8A, FIG. 8B, FIG. 8C, FIG. 8D, FIG. 8E and FIG. 8F are cross-sectional views of a semiconductor structure at various stages of fabrication, in accordance with some embodiments of a method of manufacturing a semiconductor device package of the present disclosure. Various figures have been simplified to more clearly present aspects of the present disclosure.

Referring to FIG. 8A, a carrier strip (or a carrier panel) including a carrier (or substrate) 70 is provided. The carrier strip defines a plurality of openings (or through holes) 70h penetrating the carrier strip. Electronic components 11a and 11b are disposed on a surface 701 of the carrier strip and an electronic component 11c is disposed on a surface 702 of the carrier strip opposite to the surface 701. In some embodiments, the electronic components 11a, 11b and 11c are disposed on the carrier strip by a surface mount technique, a wire bonding technique or a flip-chip technique. Electrical contacts 10b are disposed on the surface 702 of the carrier strip. In some embodiments, the electrical contacts 10b are solder bumps or copper pillars. A frame board 80 attached to an adhesive layer 80h is disposed on the electrical contacts 10b. In some embodiments, the adhesive layer 80h includes a thermal tape.

Referring to FIG. 8B, the carrier strip is disposed within a molding chamber 78. The molding chamber 78 includes a first mold chase 78a and a second mold chase 78b corresponding to the first mold chase 78a. In some embodiments, the edge of the carrier strip is sandwiched by the first mold chase 78a and the second mold chase 78b to fix the carrier strip during the molding process. In some embodiments, the first mold chase 78a includes one or more protruding structures 78c (e.g., dummy runners) in contact with the surface 702 of the carrier strip.

A molding material 79 is injected or applied to the second mold chase 78b. The molding material 79 may include an epoxy resin including fillers, a molding compound (e.g., an epoxy molding compound or other molding compound), a polyimide, a phenolic compound or material, a material including a silicone dispersed therein, or a combination thereof.

Referring to FIG. 8C, a plate 78b1 of the second mold chase 78b moves toward the first mold chase 78a to push the molding material 79 to flow from the surface 701 of the carrier strip to the surface 702 of the carrier strip through the openings 70h. Then, the molding material 79 is cured or hardened by providing heat to the molding material 79 to form an encapsulant 79' covering the electronic components 11a, 11b, 11c, the electrical contacts 10b and the frame board 80. For example, the encapsulant 79' is formed by a compression molding technique.

Referring to FIG. 8D, the structure in FIG. 8C is removed from the molding chamber 78, and the adhesive layer 80h is removed from the frame board 80. After the structure in FIG. 8C is removed from the molding chamber 78, one or more openings 79h corresponding to the one or more protruding structures 78c expose one or more portions of the surface 702 of the carrier strip that were in contact with the one or more protruding structures 78c.

Referring to FIG. 8E, the openings 79h are filled with conductive materials to form conductive posts 74. Then, singulation may be performed to separate out individual semiconductor device packages as shown in FIG. 8F. That is, the singulation is performed through the encapsulant 79' and the carrier strip including the carrier 70. The singulation may be performed, for example, by using a dicing saw, laser or other appropriate cutting technique.

Then, a conductive layer 73 is formed to cover surfaces 792 and 793 of the encapsulant 79', a lateral surface 703 of the carrier 70 and a portion of lateral surfaces of the conductive posts 74. In some embodiments, the conductive layer 73 is formed by, for example, sputtering or other suitable techniques. In some embodiments, the semiconductor device package in FIG. 8F is similar to the semiconductor device package 3 in FIG. 3B.

In accordance with the embodiments in FIG. 7A through FIG. 7H and FIG. 8A FIG. 8F, by forming openings 70h to penetrate the carrier strip, the molding material 79 can flow from one surface of the carrier strip to an opposite surface of the carrier strip, and thus the double-sided molding operation can be achieved in a single molding process, which would reduce the time and cost for manufacturing the semiconductor device package. In addition, the formation of the conductive post 74 can provide for a thermal dissipation path for the semiconductor device package, which would improve the performance of the heat dissipation of the semiconductor device package.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" or "about" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 μm, no greater than 2 μm, no greater than 1 μm, or no greater than 0.5 μm. A surface can be deemed to be planar or substantially planar if a difference between a highest point and a lowest point of the surface is no greater than 5 μm, no greater than 2 μm, no greater than 1 μm, or no greater than 0.5 μm.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations do not limit the present disclosure. It can be clearly understood by those skilled in the art that various changes may be made, and equivalent components may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A semiconductor device package, comprising:
   a substrate having a first surface, a second surface opposite to the first surface and a plurality of lateral surfaces extending between the first surface and the second surface, the substrate defining a first opening and a second opening that extend between the first surface and the second surface and respectively expose the plurality of lateral surfaces; and
   a monolithic encapsulant comprising a first portion disposed on the first surface of the substrate, a second portion disposed on the second surface of the substrate and a third portion disposed within the first opening and the second opening,
   wherein the first opening is recessed in a boundary of the substrate,
   wherein the first opening or the second opening is disposed at a corner between two adjacent lateral surfaces of the plurality of lateral surfaces.

2. The semiconductor device package of claim 1, wherein the first opening is disposed adjacent to a first lateral surface of the plurality of lateral surfaces and the second opening is disposed adjacent to a second lateral surface of the plurality of lateral surfaces.

3. The semiconductor device package of claim 1, further comprising a conductive post disposed on the second surface of the substrate and encapsulated by the second portion of the monolithic encapsulant, wherein a portion of the second portion of the monolithic encapsulant is disposed between the conductive post and the second surface of the substrate.

4. The semiconductor device package of claim 3, wherein the conductive post is spaced apart from the second surface of the substrate by the monolithic encapsulant.

5. The semiconductor device package of claim 3, wherein a lower surface of the conductive post and a portion of a lateral surface of the conductive post are exposed from the monolithic encapsulant.

6. The semiconductor device package of claim 5, further comprising a conductive layer disposed on an upper surface and a lateral surface of the first portion of the monolithic encapsulant, a lateral surface of the third portion of the monolithic encapsulant, the plurality of lateral surfaces of the substrate and the portion of the lateral surface of the conductive post.

7. The semiconductor device package of claim 3, further comprising an electrical contact disposed on the second surface of the substrate and exposed from the monolithic encapsulant.

8. The semiconductor device package of claim 3, further comprising a frame board disposed on the second surface of the substrate, wherein a portion of the frame board is exposed from the monolithic encapsulant.

9. The semiconductor device package of claim 8, wherein a portion of a lateral surface of the frame board is substantially coplanar with a lateral surface of the monolithic encapsulant.

10. The semiconductor device package of claim 9, wherein the frame board defines a notch accommodating the conductive post.

11. A semiconductor device package, comprising:
a substrate having a first surface and a second surface opposite to the first surface;
an encapsulant covering the first surface and the second surface of the substrate, the encapsulant defining an opening;
a conductive post disposed within the opening, the conductive post having a top surface facing the second surface; and
a frame board disposed on the second surface of the substrate;
wherein the frame board defines a notch accommodating the conductive post; and
wherein the encapsulant covers the conductive post.

12. The semiconductor device package of claim 11, wherein the conductive post is spaced apart from the substrate by the encapsulant.

13. The semiconductor device package of claim 11, wherein a lower surface and a portion of a lateral surface of the conductive post are exposed from the encapsulant.

14. The semiconductor device package of claim 13, further comprising a conductive layer covering the encapsulant, a lateral surface of the substrate and the portion of the lateral surface of the conductive post.

15. The semiconductor device package of claim 11, wherein the substrate defines a first opening and a second opening extending between the first surface and the second surface of the substrate, and wherein the encapsulant is disposed within the first opening and the second opening.

16. The semiconductor device package of claim 15, wherein
the substrate has a plurality of lateral surfaces extending between the first surface and the second surface;
the first opening of the substrate is disposed adjacent to a first lateral surface of the plurality of lateral surfaces; and
the second opening of the substrate is disposed adjacent to a second lateral surface of the plurality of lateral surfaces.

17. The semiconductor device package of claim 16, wherein the first opening of the substrate or the second opening of the substrate is disposed at a corner between two adjacent lateral surfaces of the plurality of lateral surfaces.

18. The semiconductor device package of claim 11, further comprising an electrical contact disposed on the second surface of the substrate and exposed from the encapsulant.

* * * * *